United States Patent
Zheng et al.

(10) Patent No.: US 6,794,232 B2
(45) Date of Patent: Sep. 21, 2004

(54) METHOD OF MAKING MOSFET GATE ELECTRODES WITH TUNED WORK FUNCTION

(75) Inventors: Jun-Fei Zheng, Palo Alto, CA (US); Brian Doyle, Cupertino, CA (US); Gang Bai, San Jose, CA (US); Chunlin Liang, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/383,842

(22) Filed: Mar. 7, 2003

(65) Prior Publication Data

US 2003/0151074 A1 Aug. 14, 2003

Related U.S. Application Data

(62) Division of application No. 10/071,144, filed on Feb. 6, 2002, which is a division of application No. 09/451,696, filed on Nov. 30, 1999, now Pat. No. 6,373,111.

(51) Int. Cl.⁷ .............................................. H01I 21/337
(52) U.S. Cl. ..................................... 438/186; 438/188
(58) Field of Search .......................... 438/252, 92, 672, 438/643, 653, 186–199

(56) References Cited

U.S. PATENT DOCUMENTS

| 6,028,339 | A | 2/2000 | Frenette et al. |
| 6,091,120 | A | 7/2000 | Yeom et al. |
| 6,140,688 | A | 10/2000 | Gardner et al. |
| 6,171,910 | B1 | 1/2001 | Hobbs et al. |
| 6,373,111 | B1 | 4/2002 | Zheng et al. |
| 2002/0008257 | A1 * | 1/2002 | Barnak et al. ............... 257/262 |

* cited by examiner

*Primary Examiner*—Dung A. Le
(74) *Attorney, Agent, or Firm*—Blakely, Sokoloff, Taylor & Zafman LLP (57) ABSTRACT

Insulated gate field effect transistors having gate electrodes with at least two layers of materials provide gate electrode work function values that are similar to those of doped polysilicon, eliminate the poly depletion effect and also substantially prevent impurity diffusion into the gate dielectric. Bi-layer stacks of relatively thick Al and thin TiN for n-channel FETs and bi-layer stacks of relatively thick Pd and thin TiN, or relatively thick Pd and thin TaN for p-channel FETs are disclosed. Varying the thickness of the thin TiN or TaN layers between a first and second critical thickness may be used to modulate the work function of the gate electrode and thereby obtain the desired trade-off between channel doping and drive currents in FETs.

4 Claims, 5 Drawing Sheets

METHOD OF MAKING MOSFET GATE ELECTRODES WITH TUNED WORK FUNCTION

This is a Divisional application of Ser. No.10/071,144 filed Feb. 6, 2002, which is a Divisional of application Ser. No.: 09/451,696 filed Nov. 30, 1999 now U.S. Pat. No. 6,373,111.

BACKGROUND OF THE INVENTION

1. Field of the Invention

The invention relates generally to the structure and fabrication of insulated gate field effect transistors, and more particularly to multi-layer metal gate electrodes.

2. Background

Advances in semiconductor manufacturing technology have led to the integration of tens, and more recently hundreds, of millions of circuit elements, such as transistors, on a single integrated circuit (IC). To achieve such dramatic increases in the density of circuit components has required semiconductor manufacturers to scale down the physical dimensions of the circuit elements, as well as the interconnection structures used to connect the circuit elements into functional circuitry.

One consequence of scaling down the physical dimensions of circuit elements has been a dramatic increase in the complexity of transistor engineering for the process engineers and scientists that develop advanced microelectronic manufacturing processes. In the past it was common to consider gate oxide thickness, polysilicon line width, source/drain junction depth and lateral diffusion therefrom, and some threshold adjusting ion implant as the primary parameters of transistor design. However as transistor dimensions entered the deep submicron region, the transistor structure became more complex with the inclusion of elements such as graded well doping, epitaxial wafers, halo implants, tip implants, lightly doped drain structures, multiple implants for source/drain formation, silicidation of gates and source/drains, and multiple sidewall spacers, among others. Because of the complex nature of deep submicron transistors, workers in this field tend to characterize, or specify, transistors not so much by physical dimension (e.g., gate length) but rather by electrical characteristics such as drive current ($I_{on}$) versus leakage current ($I_{off}$).

For high speed operation of microelectronic components, circuit designers prefer transistors tuned for high drive currents. On the other hand, low leakage, i.e., low off-state current, is preferred so as to reduce power consumption. Typically, the structural and doping parameters that tend to provide the desired increase in drive current also tend to provide an undesired increase in leakage current.

What is needed are structures and methods for obtaining the desired electrical performance from insulated gate field effect transistors.

SUMMARY OF THE INVENTION

Briefly, insulated gate field effect transistors having gate electrodes with at least two layers of materials wherein the work function of the gate is substantially determined by thickness of one of the layers are disclosed. Such transistors provide gate electrode work function values that can be tuned for particular transistor performance requirements, and are similar to those of doped polysilicon, eliminate the poly depletion effect and also substantially prevent impurity diffusion into the gate dielectric.

In a further aspect of the present invention specific value ranges for gate electrode work function can be achieved by selecting particular thicknesses for a work function modulation layer that is disposed superjacent to a gate insulating layer.

DETAILED DESCRIPTION

Overview

Many trade-offs are made when designing the structure of a metal-oxide-semiconductor (MOS) field effect transistor (FET). In particular, trade-offs are made between trying to maximize drive current and minimize leakage current because, generally the changes that are helpful for increasing drive current are disadvantageous for reducing leakage current and vice versa. For example, metal gate electrodes can be used to improve drive current by eliminating the polysilicon carrier depletion effect. However, simply replacing polysilicon gate electrodes with metal gate electrodes may introduce other problems, such as increased leakage current because the metal, although eliminating polysilicon carrier depletion, provides an undesired value of work function, which in turn provides undesired electrical characteristics for the transistor.

Embodiments of the present invention obtain favorable drive current and leakage current values because the threshold voltage can be modulated by changes to the gate electrode work function. In this way, channel doping can be reduced thereby improving carrier mobility and thus drive current, without increasing the subthreshold leakage currents that are normally associated with lightly doped channel regions. As noted above, metal gate electrodes can reduce or eliminate the polysilicon carrier depletion effect, but result in an unfavorable value for the gate electrode work function. Embodiments of the present invention include at least two layer of conductive material in FET gate electrodes wherein the work function this gate stack is between the work functions of the first and second materials, inclusively.

Insulated gate field effect transistors having gate electrodes with at least two layers of materials provide gate electrode work function values that are similar to those of doped polysilicon, eliminate the poly depletion effect and also substantially prevent impurity diffusion into the gate dielectric. Bi-layer stacks of a relatively thick conductive layer superjacent a relatively thin conductive layer superjacent a gate dielectric achieve the desired electrical characteristics. Illustrative embodiments of the present invention are disclosed which include bi-layer stacks of relatively thick Al and thin TiN for n-channel FETs, and bi-layer stacks of relatively thick Pd and thin TiN, or relatively thick Pd and thin TaN for p-channel FETs. Varying the thickness of the thin TiN or TaN layers between a first and second critical thickness may be used to modulate the work function of the gate electrode and thereby obtain the desired trade-off between channel doping and drive currents in FETs.

Terminology

The terms, chip, integrated circuit, monolithic device, semiconductor device or component, microelectronic device or component, and similar expressions, are often used interchangeably in this field. The present invention is applicable to all the above as they are generally understood in the field.

The term "gate" is context sensitive and can be used in two ways when describing integrated circuits. While the term gate may refer to a circuit for realizing an arbitrary logical function when used in the context of a logic gate, as used herein, gate refers to the insulated gate electrode of a three terminal FET. Although a FET can be viewed as a four terminal device when the semiconductor body is considered, for the purpose of describing illustrative embodiments of the present invention, the FET will be described using the traditional gate-drain-source, three terminal model.

Polycrystalline silicon is a nonporous form of silicon made up of randomly oriented crystallites or domains. Polycrystalline silicon is often formed by chemical vapor deposition from a silicon source gas or other methods and has a structure that contains large-angle grain boundaries, twin boundaries, or both. Polycrystalline silicon is often referred to in this field as polysilicon, or sometimes more simply as poly.

Source/drain terminals refer to the terminals of a FET, between which conduction occurs under the influence of an electric field, subsequent to the inversion of the semiconductor surface under the influence of an electric field resulting from a voltage applied to the gate terminal, or electrode. Source/drain terminals are typically formed in a semiconductor substrate and have a conductivity type (i.e., p-type or n-type) that is the opposite of the conductivity type of the substrate. Sometimes, source/drain terminals are referred to as junctions. Generally, the source and drain terminals are fabricated such that they are geometrically symmetrical. Source/drain terminals may include extensions, sometimes referred to as tips, which are shallower than other portions of the source/drain terminals. The tips typically extend toward the channel region of a FET, from the main portion of the source/drain terminal. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

The term vertical, as used herein, means substantially perpendicular to the surface of a substrate.

Transistor scaling typically involves more than just the linear reduction of the FET width and length. For example, both source/drain (S/D) junction depth and gate insulator thickness are also typically reduced in order to produce a FET with the desired electrical characteristics.

As is well known, the gate electrode of a FET is commonly formed from a patterned layer of polycrystalline silicon. The polysilicon gate electrodes are commonly doped such that the gate electrodes of n-channel FETs (NFETs) are n-type, and the gate electrodes of p-channel FETs (PFETs) are p-type. The doping of the polysilicon gate electrode affects its work function. The work function in turn affects the threshold voltage of the FET.

Since doped polysilicon is a semiconductive material, it tends to experience the formation of a depletion region adjacent to the interface between the gate electrode and the gate insulator when a voltage is applied to the gate electrode. As device scaling has substantially reduced the thickness of the gate insulator layer, the width of the depletion region in the doped polysilicon gate electrode has come to play a more significant role in determining the electrical characteristics of the FET. Unfortunately, the occurrence of this depletion region in the gate electrode tends to degrade transistor performance.

It has been recognized that replacing polysilicon gate electrodes with metal gate electrodes can eliminate the poly depletion effect. However, there are a number of problems that arise from replacing polysilicon gate electrodes with metal gate electrodes including, but not limited to, the mismatch of the metal work function values, with respect to those of the doped polysilicon which is being replaced, and the danger of metal diffusion into the gate dielectric layer.

As noted above, with polysilicon gate electrodes, as the gate dielectric layer becomes thinner, the poly depletion layer becomes a more significant component in determining the electrical characteristics of a FET. Although replacing polysilicon with metal solves the poly depletion problem it introduces a number of other difficulties including but not limited to work function mismatches and impurity diffusion into the gate dielectric layer. In accordance with the present invention, a multi-layer gate electrode stack is used to overcome the problems of work function mismatch and impurity diffusion that are created by the replacement of polysilicon gate electrodes with metal gate electrodes.

Work function is determined by the electronic and structural properties of a material. Typically, MOS transistors require the work function of a gate electrode to be close to that of the conduction band edge (e.g., n+ poly for NFETs) or close the valence band edge (e.g., p+ poly for PFETs) in order to achieve desirable electrical performance from those transistors. Presently, there are a limited number of materials that are known to provide work functions in the desired ranges. Additionally, some of these materials are difficult to process, and so are undesirable to integrate into a semiconductor manufacturing process.

Embodiments of the present invention include a bi-layer metal gate stack which includes a work function modulation layer. In one embodiment, a layer of Al is disposed superjacent a work function modulation layer comprising TiN. The work function modulation layer is disposed intermediate the Al and the gate dielectric layer.

When the thickness of the work function modulation layer is in the range of approximately 10–20 angstroms, the Al/TiN bi-layer metal exhibits a work function equivalent to that of Al. Whereas, when the TiN thickness is in the range of 20–200 angstroms, the work function of the Al/TiN bi-layer changes from that of Al to that of TiN (i.e., a mid-gap work function).

Work-Function and Vt

Several experiments were conducted using p-type wafers. P-type wafers having a top epitaxial layer approximately 2.75 microns thick with a boron doping concentration of approximately $1 \times 10^{16}$ cm$^{-3}$, and a substrate having a boron doping concentration of approximately $8 \times 10^{18}$–$2 \times 10^{19}$ cm$^{-3}$ were used for these experiments. MOS capacitor structures were formed on the wafers. These capacitors were formed with an oxide of silicon as the dielectric layer, an Al/TiN bilayer as a first terminal and the substrate as the second terminal of the capacitor. In a typical experimental arrangement, five different capacitor sizes, ranging from $7.2 \times 10^{-5}$ cm$^2$ to $6.9 \times 10^{-2}$ cm$^2$ were used. Typically, the smaller size capacitors are used for accurate determination of electrical oxide thickness and the larger capacitors are used to determine average gate leakage per unit area.

Al/TiN is formed by a chemical vapor deposition (CVD) process in which TiN is deposited followed by deposition of Al. CVD equipment and process conditions for deposition of such materials are generally known in the industry. Generally, organic Al precursors and TiN precursors are introduced into a reaction chamber and decompose when heated such that Al and TiN are deposited on a substrate. TiN is deposited first at approximately 230° C., followed by CVD of Al approximately at 370° C., preferably in the same reaction chamber. In-situ processing is a technique to accomplish the important goal of avoiding oxidation of the TiN. The CVD TiN process is modified from conventional TiN processes by eliminating the plasma step normally applied to condense a TiN film in order to minimize potential plasma impact to the gate dielectric layer.

Figure 1:
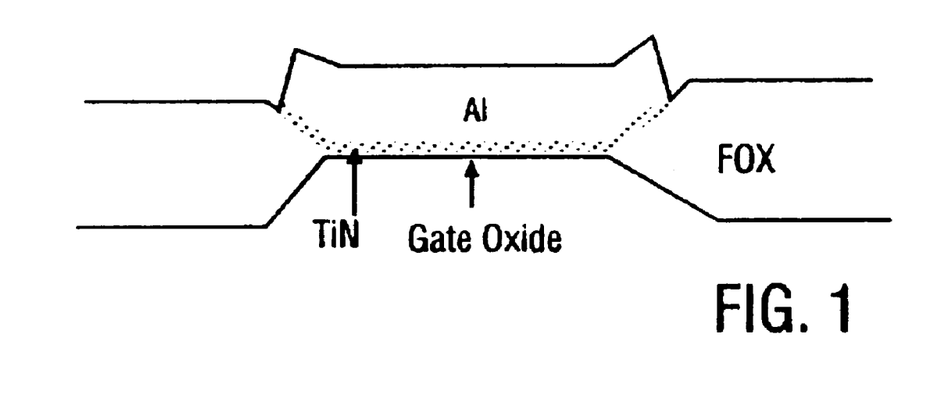
FIG. 1 is a schematic cross-section of an MOS capacitor of the type used to measure various electrical characteristics.
Figure 2:
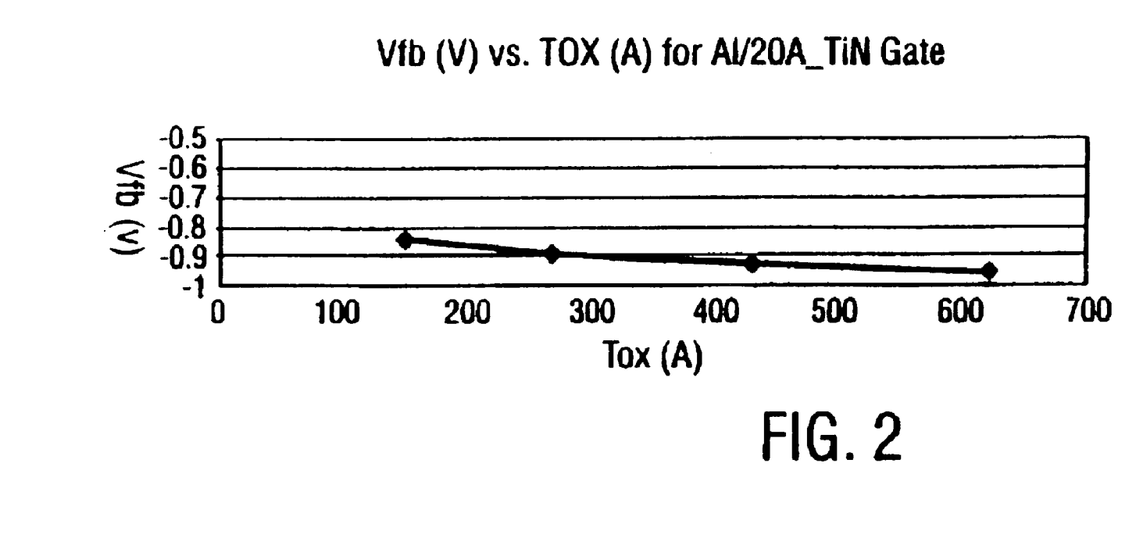
FIG. 2 is a graph showing the relationship between the flatband voltage, Vfb, and dielectric thickness, Tox, in an MOS capacitor having the substrate as one terminal, an oxide of silicon as the dielectric, and having a bi-layer metal stack as the second terminal, with 20 angstroms of titanium nitride (TiN) disposed between a thick layer of aluminum and the dielectric layer.

The work function is determined as shown in FIG. 2. For accurate work-function determination, it is preferred that all the capacitors have substantially identical fixed oxide charges in the oxide/silicon interface. It is also preferable to use a variety of oxide thicknesses in making the determination of the value of the work function. To ensure that all capacitors have substantially identical fixed oxide charges, the gate oxide is first grown to 600 angstroms on a wafer. Then the oxide is etched back to create 4 quadrants of about 600 angstroms, 400 angstroms, 300 angstroms, and 100 angstroms thickness on the wafer. A series of 6:1 wet buffered oxide etch operations (BOE) were performed. These etch operations were done by manually dipping half of the wafer into the wet solution to remove approximately 200 angstroms of oxide to thereby achieve an oxide thickness on half of the wafer of approximately 400 angstroms. The wafer was then rotated 90° to dip half of the wafer again to remove approximately 300 angstroms of oxide. In this way, four regions, or quadrants of the wafer are created, each having a different thickness of oxide thereon. Because ¼ of the wafer was subjected to the removal of 200 angstroms and then 300 angstroms of oxide, a total 500 angstroms was removed and this ¼ wafer consequently had approximately 100 angstroms of oxide remaining. Another ¼ of the wafer was subjected only to the removal of 300 angstroms and therefore has an oxide thickness of approximately 300 angstroms. And the ¼ of the wafer, which is never dipped, retains its original 600 angstrom layer of oxide. A precise determination Tox is made by capacitance versus voltage (CV) measurements.

With reference now to FIG. 2, determination of work-function $\Phi_{metal}$ is performed using the relation: $V_{fb} = \Phi ms + [Qox\ Total]/Cox = \Phi ms + [Qox\ per\ area]*TOX$, where $\Phi ms = \Phi_{metal} - \Phi_{Si} = V_{fb}$ (at Tox=0), so $\Phi_{metal} = \Phi_{Si} + V_{fb}$ (at Tox=0). $\Phi_{Si}$ is calculated from the boron doping determined by capacitor-voltage measurements.

Work-function Modulation by TiN Thickness

Figure 3:
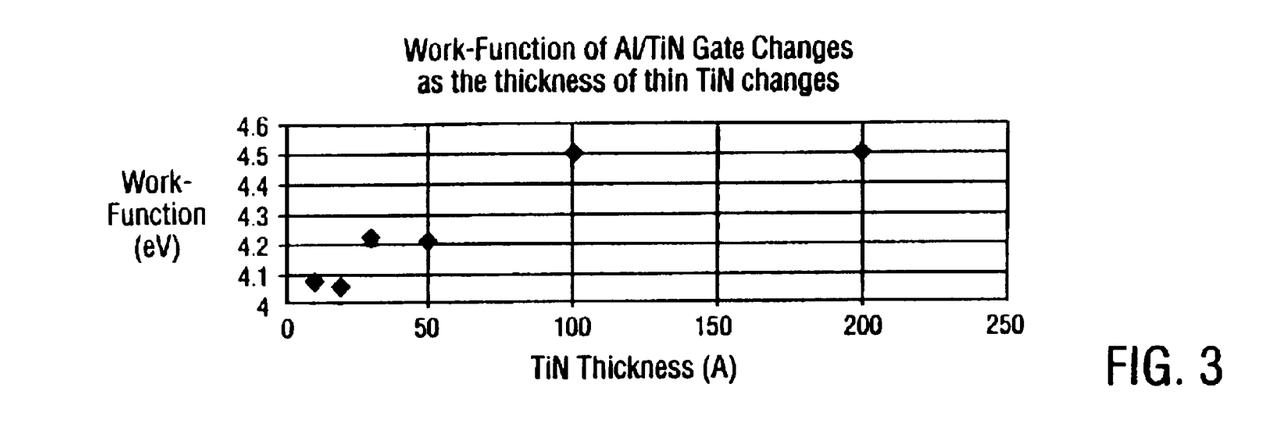
FIG. 3 is a graph showing the relationship between the work function of a bi-layer metal stack (Al/TiN) and the thickness of a work function modulation layer.

FIG. 3 illustrates the work function of Al/TiN with various TiN thicknesses from 10 angstroms to 200 angstroms. For TiN less than 20 angstroms, the Al/TiN gate work function is the same as reported Al work-function (~4.08 eV). For TiN greater than 100 angstroms, the Al/TiN gate work function is approximately the same as reported TiN work-function (4.5 V). For TiN thickness from 20 angstroms to 100 angstroms, the work function can be changed as the TiN thickness is changed.

Table 1 (below) presents threshold voltage data for two types of transistors. Each of these two types of transistors is substantially identical except for the construction of the gate electrodes, which are fabricated respectively with a gate stack of Al, and 10 angstroms of TiN, and with a gate stack of n+ poly gate ($7 \times 10^{19}$/cm$^3$ doped). Both transistors are fabricated using replacement gate process. The threshold voltage Vt is seen to be equivalent, confirming that the gate stack of Al and an underlying 10 angstroms of TiN has work-function equivalent to that of n+ poly (i.e., ~4.17 eV).

TABLE 1

| 0.5 um transistor with Al/10A_TiN/57A_Gate Oxide Vt = 0.184 +/− 0.056 (V) | 0.5 um n-MOS transistor n+ poly/57A_ate Oxide Vt = 0.178 +/− 0.0124 (V) |
| --- | --- |

Transistor Vt Modulation by TiN Thickness

Figure 4:
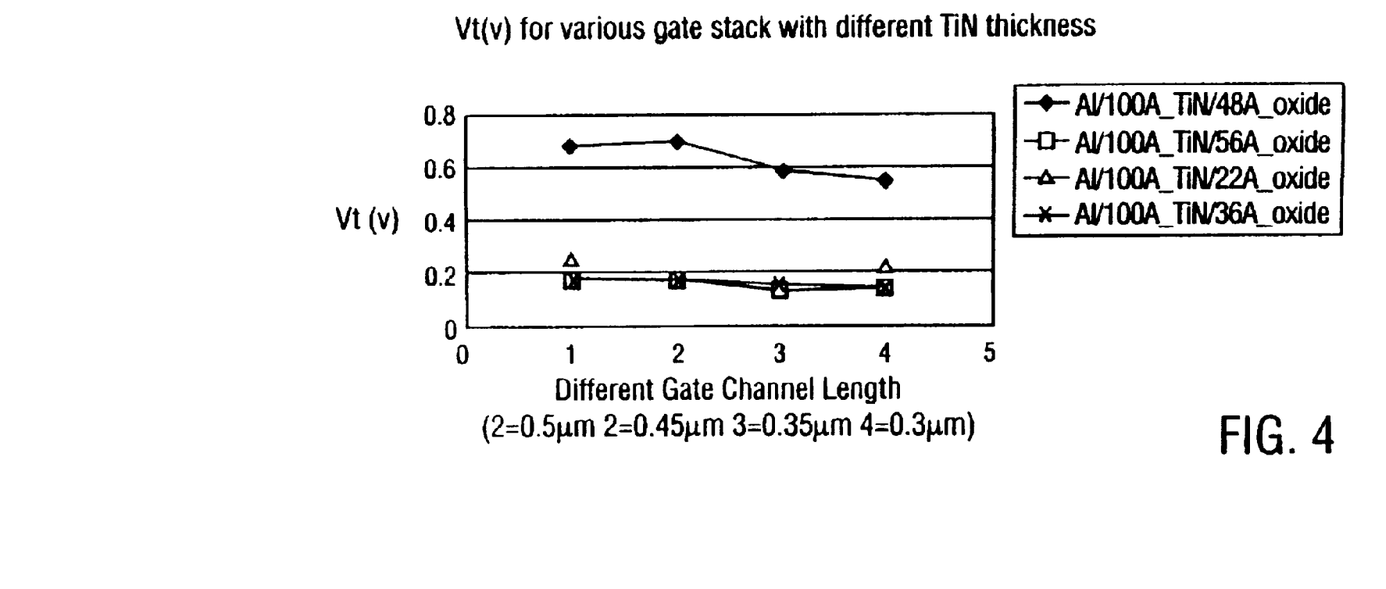
FIG. 4 is a graph illustrating the relationship between threshold voltage, gate dielectric thickness, channel length, and gate electrode composition.

FIG. 4 illustrates how transistor threshold voltage (Vt) changes with respect to changes in the thickness of the work function modulation layer, in this example TiN. Although the oxide thickness is not quite the same, and Vt is also a function of oxide thickness, the oxide thickness impact is a secondary factor here. Vt change is proportional to changes in the value of the gate electrode work function. The Vt of transistors with gate stacks formed of Al, 100 angstroms of TiN, and 48 angstroms of oxide, is higher than that of transistors with gate stacks formed of Al, 10 angstroms of TiN, and 36 angstroms of oxide, and is also higher than that of transistors with gate stacks formed of Al, 10 angstroms of TiN, and 57 angstroms of oxide, by approximately 0.4 V for all practical channel lengths. The Vt of transistors with gate stacks formed of Al, 50 angstroms of TiN, and 23 angstroms of oxide, is higher than that of transistors with gate stacks formed of Al, 10 angstroms of TiN, and 36 angstroms of oxide by approximately 0.1 V.

For gate leakage study, wafers with substantially identical thin gate dielectric processing were split into a first group having gate electrodes formed of a thick layer of Al and 10 angstroms of TiN, and a second group having n+ poly gate electrodes. A gate dielectric (an oxide of silicon in this case) thickness of 18 angstroms was targeted, as shown in Table 2, by a combination of dry and wet oxidations. The thickness was tweaked by altering oxidation time in order to make some of the oxide layers thinner than 18 angstroms and some of the oxide layers thicker than 18 angstroms. Those skilled in the art will recognize that the exact physical thickness is very difficult to measure clearly. However, the electrical thicknesses were determined by measuring, at accumulation, a capacitor having a size of $7.22 \times 10^5$ cm$^2$.

TABLE 2

| Target Oxide Thickness | dry oxidation | wet oxidation | Tox for stack of Al/TiN/SiO$_2$ (TiN thickness = 10 angstroms) |
|---|---|---|---|
| 18− angstroms | 1 min | 1 mm | 21.6 angstrom |
| 18 angstroms | 1.5 min | 1.5 min | 22 angstrom |
| 18+ angstroms | 1.5 min | 10 min | 27 angstrom |

Figure 5:
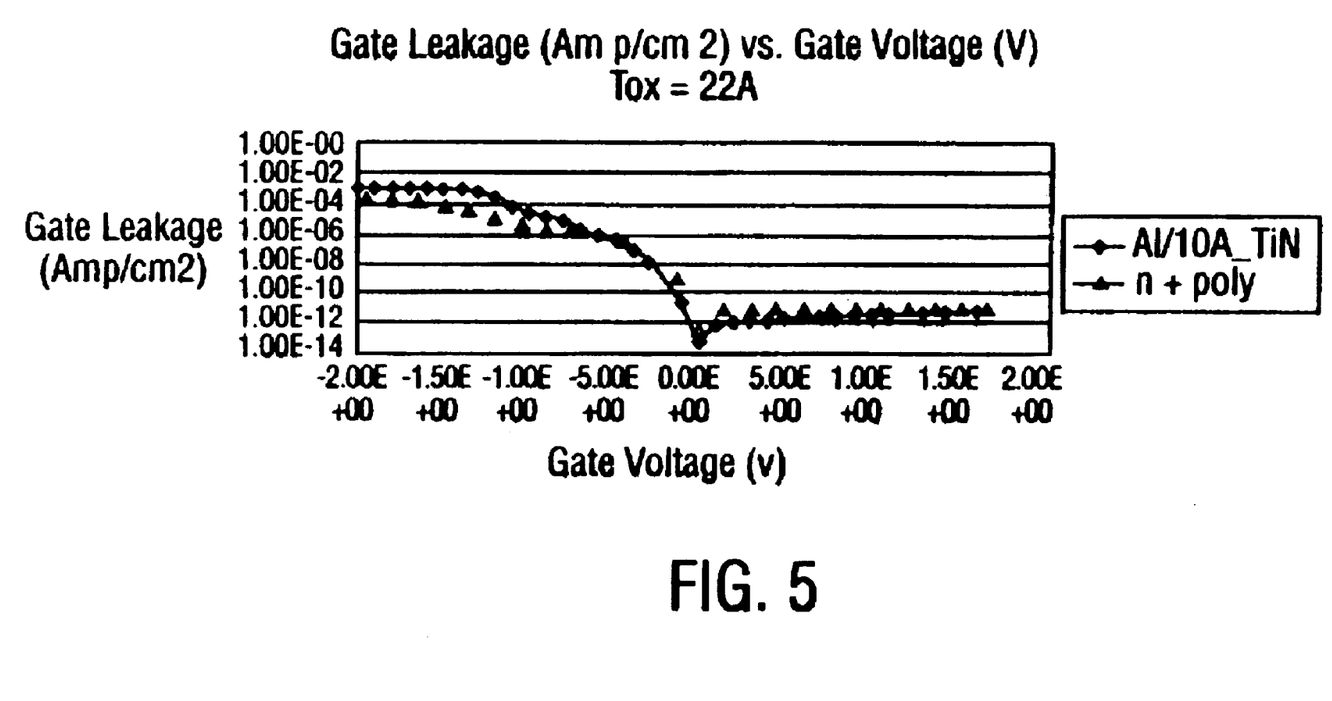
FIG. 5 is graph showing the relationship between gate leakage current and applied gate voltage for both a device with an n-doped polysilicon electrode, and a device with a thick aluminum and 10 angstrom TiN bi-layer stack electrode, wherein the dielectric layer is an oxide of silicon 22 angstroms thick.

Referring to FIG. 5, a comparison is shown of gate leakage measured (with MOS capacitor structures) first from Al/10A__TiN gate electrode and second from n+ poly gate electrode. The gate leakage is approximately the same for the Al/10A__TiN gate and the n+ poly gate. The gate oxide layer is the same for these capacitors with Al/10A__TiN gate and n+ poly gate.

Figure 6:
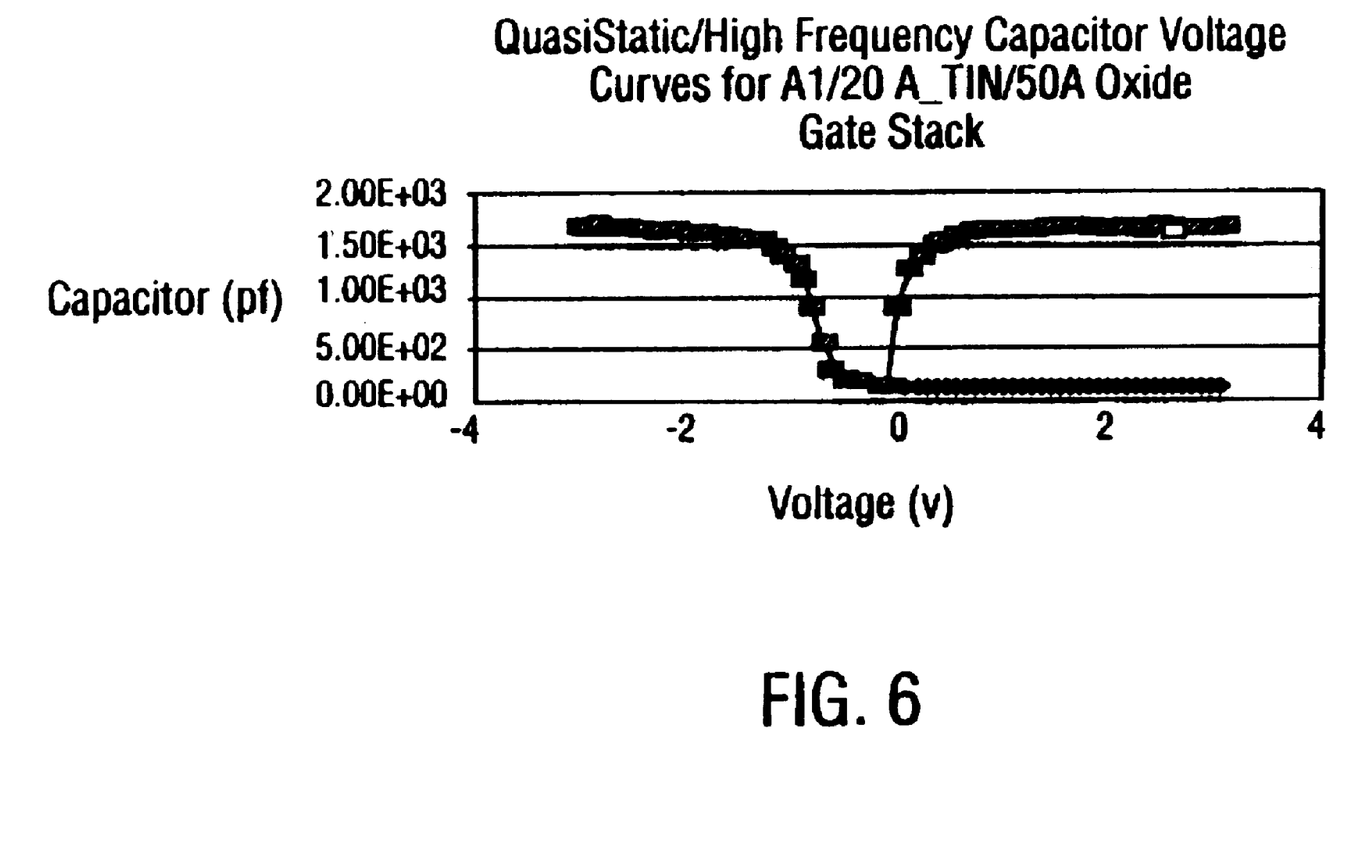
FIG. 6 is a graph showing the relationship between capacitance and voltage for an MOS capacitor structure having one terminal made up of an Al and 20 angstrom TiN bi-layer stack, and a dielectric of an oxide of silicon 50 angstroms thick. In the quasi-static curve, the capacitance at depletion and the capacitance at accumulation are equal, indicating elimination of the carrier depletion effect in the gate electrode.

FIG. 6 is a graph showing the relationship between capacitance and voltage for an MOS capacitor structure having one terminal made up of an Al, and 20 angstrom thick TiN, bi-layer stack, and a dielectric of an oxide of silicon 50 angstroms thick. The quasi-static curve shows the capacitance at depletion and the capacitance at accumulation are equal, indicating success in the substantial elimination of the carrier depletion effect in the gate electrode.

Figure 7:
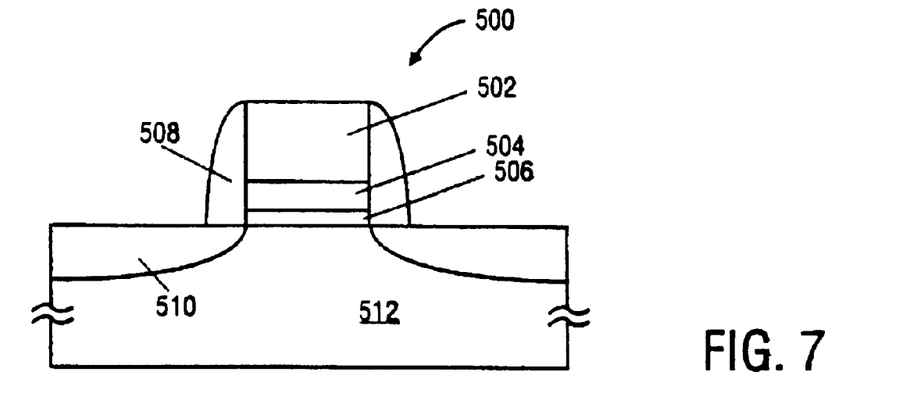
FIG. 7 is a schematic cross-sectional view of a transistor in accordance with the present invention having a work function modulation layer disposed between a dielectric layer and an overlying, thicker layer of a conductive material which is different from that of the work function modulation layer.

FIG. 7 shows a schematic cross-sectional view of a FET 500 having a conductive overlayer 502, a work function modulation layer 504, a gate dielectric layer 506, sidewall spacers 508, source/drain terminals 510 and a substrate 512. Conductive overlayer 502 and work function modulation layer 504 together, form the gate electrode.

Figure 8:
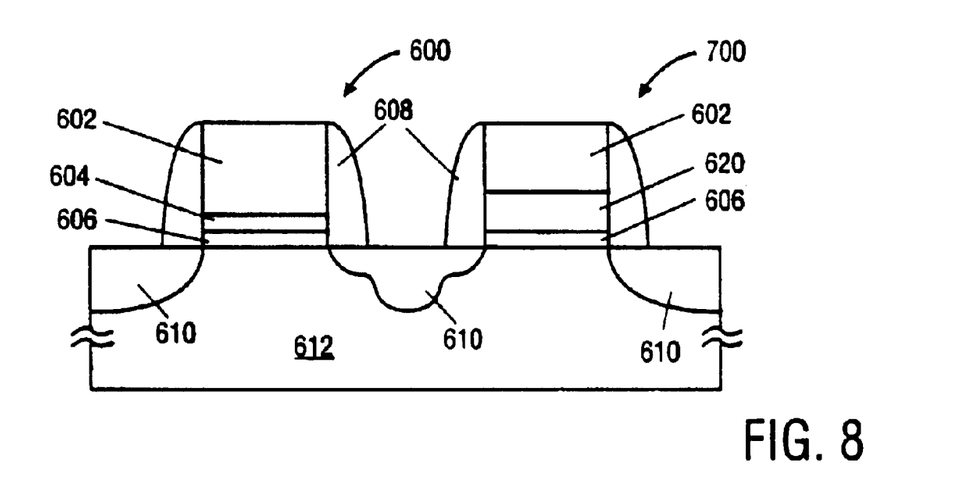
FIG. 8 is a schematic cross-sectional view of an integrated circuit in accordance with the present invention having a first transistor with a work function modulation layer of a first thickness disposed between a dielectric layer and an overlying, thicker layer of a conductive material which is different from that of the work function modulation layer and second transistor with a work function modulation layer of a second thickness disposed between a dielectric layer and an overlying, thicker layer of a conductive material which is different from that of the work function modulation layer, and the first and second work function modulation layers have thicknesses which are different from each other.

FIG. 8 shows a schematic cross-sectional view of an integrated circuit having FETs 600, 700, both of the same conductivity type, formed thereon. FET 600, has a conductive overlayer 602, a Work function modulation layer 604, a gate dielectric layer 606, sidewall spacers 608, source/drain terminals 610 and a substrate 612. Conductive overlayer 602 and work function modulation layer 604 together, form the gate electrode. FET 700 is very similar, having a conductive overlayer 602, a work function modulation layer 620, a gate dielectric layer 606, sidewall spacers 608, source/drain terminals 610 and a substrate 612. FETs 600 and 700 differ in the thickness of their respective work function modulation layers. By providing different thickness work function modulation layers, the work function of the gate electrodes is different, and therefore the transistor thresholds are different. In this way, p-channel, n-channel, or both types of transistors may be fabricated on an integrated circuit with various ones of a plurality of transistors having different threshold voltages.

Experiments have demonstrated TiN to be an effective diffusion barrier layer to maintain low gate leakage without adversely affecting the Al work-function in Al/TiN bi-layer structures. Furthermore, TiN work function modulation layers can be used to tune the work function for an optimal, i.e., desired, Vt.

P-channel FETs having gate electrode structures similar to those described above may also be made fabricated. Such gate electrodes may include Pd/TiN bi-layer structures. Tantalum nitride (TaN) may be used as a substitute for TiN as a diffusion barrier to make a Pd/TaN bi-layer gate electrode for p-channel transistors. Pd is known to have a work function of 5.2 V. The Pd/TaN bi-layer gate electrode is a good candidate for p-channel FET gate electrodes. Thin TaN layers may be in the range of approximately 20 to 100 angstroms.

In accordance with the present invention, integrated circuits may be constructed which have a plurality of FETs, of one or more conductivity types (i.e., p-channel, n-channel, or both), wherein the transistors of a particular conductivity type may have substantially identical channel doping profiles but different threshold voltages. The ability to achieve a range of threshold voltages without having to change the channel doping profiles of the FETs is a result of including a work function modulation layer in the gate electrode. As described above, by adjusting the thickness of the work function modulation layer between a first and a second critical thickness, the work function of the gate electrode, and consequently the threshold voltage of the transistor can be modified. In this way, a variety of transistor threshold voltages may be obtained simply by forming a corresponding variety of gate electrode stacks with different thicknesses of work function modulation layers, rather than requiring a series of ion implantation operations to modify the channel doping profiles.

Conclusion

Some embodiments of the present invention provide a bi-layer metal gate with work function modulated by one of the gate electrode layers. It will be appreciated that gate electrodes in accordance with the present invention may be fabricated which have more than two layers. One illustrative embodiment of the present invention, suitable for use with n-channel field effect transistors includes an Al/TiN bi-layer metal gate with work function determined by the thickness of the TiN layer. Other embodiments may include other material combinations, such as, for example, Pd/TiN; Pd/TaN; and Pt/TiN. The thin layers disposed between the gate dielectric layer and the thicker overlying portions of the gate electrode may be as thin as an atomic monolayer (i.e., substantially equal to the thickness of one atom or one molecule, depending on the material used).

An advantage of embodiments of the present invention is that the threshold voltage of a FET may be determined, at least in part, by selecting a work function modulation layer thickness.

An advantage of the embodiments of the present invention is that an integrated circuit may have a plurality of transistors with different threshold voltages formed thereon wherein those transistors share a common channel doping profile.

It will be understood that various other changes in the details, materials, and arrangements of the parts and steps which have been described and illustrated may be made by those skilled in the art without departing from the principles and scope of the invention as expressed in the subjoined claims.

What is claimed is:

1. A method of making a field effect transistor, comprising:

forming a gate dielectric disposed on a semiconductor, a gate electrode comprising a first material disposed over the gate dielectric, and a pair of source/drain regions substantially disposed in the semiconductor and aligned to laterally opposed sidewalls of the gate electrode; and forming a work function modulation layer comprising a second material disposed intermediate the gate dielectric and the gate electrode, wherein the thickness of the function modulation layer is such that the work function of the gate electrode is different than the work function of the first material and different from the work function of the second material.

2. The method of claim 1, wherein the work function modulation layer acts as a diffusion barrier to substantially preclude diffusion of the first material into the gate dielectric.

3. The method of claim 1, wherein the work function modulation layer is titanium nitride.

4. The method of claim 2, wherein the work function modulation layer is tantalum nitride.

* * * * *